US006631193B1

(12) United States Patent
Miller

(10) Patent No.: US 6,631,193 B1
(45) Date of Patent: Oct. 7, 2003

(54) AUDIO SYSTEM ENHANCEMENT USING PSYCHO ACOUSTIC MATRIX

(75) Inventor: Francis Allen Miller, Alameda, CA (US)

(73) Assignee: Kentech ( * ) Notice: Subject to any disclaimer, the term of this patent is extended or adjusted under 35 U.S.C. 154(b) by 0 days.

(21) Appl. No.: 09/226,705

(22) Filed: Jan. 7, 1999

(51) Int. Cl.[7] .................................................. H03G 5/00

(52) U.S. Cl. ........................................... 381/98; 381/97

(58) Field of Search ................................ 381/97, 1, 27, 381/98, 103, 99

(56) References Cited

U.S. PATENT DOCUMENTS 4,340,778 A * 7/1982 Cowans et al.
5,278,909 A * 1/1994 Edgar ............................ 381/1
5,661,808 A * 8/1997 Klayman ........................ 381/1
5,872,851 A * 2/1999 Petroff

* cited by examiner

*Primary Examiner*—Forester W. Isen
*Assistant Examiner*—Brian Pendleton
(74) *Attorney, Agent, or Firm*—Gregory Smith & Associates; Mitchell S. Rosenfeld

(57) ABSTRACT

A method of processing left and right audio signals is disclosed which reproduces the illusion of a center channel while achieving a perception by the listener of a wider speaker separation. This method is partly obtained by altering the spectral response of the left and right speaker signals to obtain left and right sets of odd and even Fourier Transforms having certain characteristics. These processed signals are re-combined with the unaltered left and right signals to produce an expanded separation image that appears to extend beyond the physical location of the actual left and right loudspeakers, and to simultaneously centralize center channel signals to a point located between the loudspeakers.

8 Claims, 11 Drawing Sheets

AUDIO SYSTEM ENHANCEMENT USING PSYCHO ACOUSTIC MATRIX

FIELD OF THE INVENTION

This invention relates generally to a method and apparatus for processing an audio signal, and more particularly, to processing stereo audio signals so that the resulting sounds produce a higher degree of channel separation than is expected for a given speaker-listener environment.

BACKGROUND

Past attempts to enhance the spatial quality of conventional stereo recordings involve deriving a composite left and right signal. These signals are processed in such a way that a listener who hears the right processed signal with his left ear will perceive a spatial quality predicted by the processing. Listening to the processed signals with earphones produce the results. Results obtained with loudspeakers will vary according to the listener-speaker relationship as defined by the laws governing the propagation of acoustic energy in a closed environment.

Such past attempts have also sacrificed the integrity of the center channel, where the left and right speaker signals are -intended to be in phase. Such past attempts also do not allow the listener to adjust the processing algorithm for the particular arrangement of speakers employed.

What is needed is a technique to enhance the spatial quality of stereo recordings without incurring the drawbacks of the prior art described above.

SUMMARY

A method of processing left and right audio signals is disclosed which reproduces the illusion of a center channel while achieving a perception by the listener of a wider speaker separation. This method is partly obtained by altering the spectral response of the left and right speaker signals to obtain left and right sets of odd and even Fourier Transforms having certain characteristics. These processed signals are re-combined with the unaltered left and right signals to produce an expanded separation image that appears to extend beyond the physical location of the actual left and right loudspeakers, and to simultaneously centralize center channel signals to a point located between the loudspeakers. The process is defined to accommodate a large range of differential propagation angles to conform to the requirements of a broad range of listening environments.

INTRODUCTION TO THE INVENTION

Separation and Differential Propagation Angle (DPA)

Figure 1:
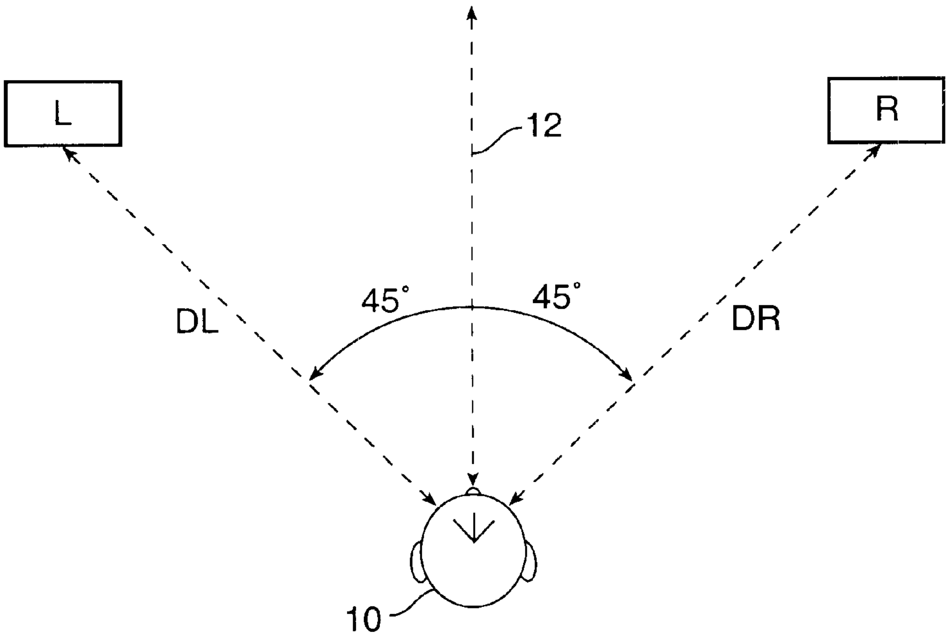
FIG. 1 is a top down view of a human head relative to left and right speakers coupled to a stereo system.

Referring to FIG. 1, first consider a listener 10 positioned between two speakers L & R. Speaker R is positioned 45° right of the listener's line of sight 12. The distance DR between the listener and the speaker R is unimportant as long as the 45° angle to the line of sight is maintained. Likewise, the second speaker L is positioned 45° left of the listener's line of sight 12. Although once again the distance DL is unimportant, let's make the distance DL approximately the same as the distance between the listener 10 and speaker R so that DL=DR. For all practical purposes, human hearing (in the audio frequency spectrum from about 200 Hz to approximately 7,000 Hz) functions much the same as a two sensor phased interferometer.

Figure 2:
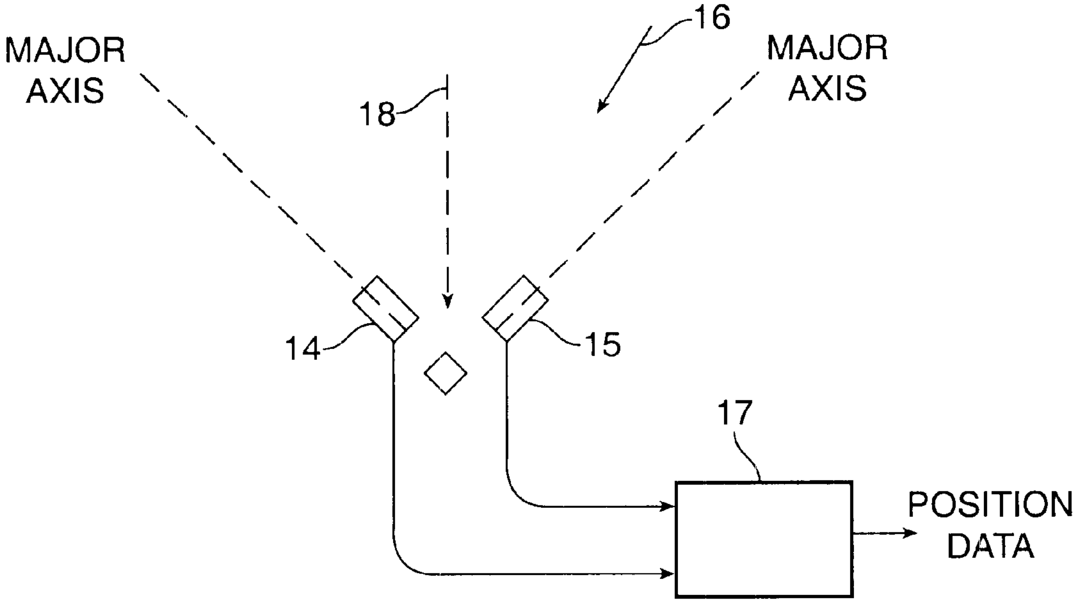
FIG. 2 illustrates an inferometer used to detect the location of a sound source.

FIG. 2 illustrates an interferometer constructed by placing two omni-directional sensors 14 and 15 at right angles to each other. The direction of incoming energy 16 with respect to a reference direction 18 may be determined by differentially analyzing the two outputs from the sensors by differential analyzer 17.

Humans are 3 dimensional beings and therefore our hearing must be analyzed spherically to be appreciated. However, for the sake of brevity, I chose to use a quick and dirty Euclidean form for our analysis. This form should provide a few basic insights, which should suffice for discussion.

Figure 3:
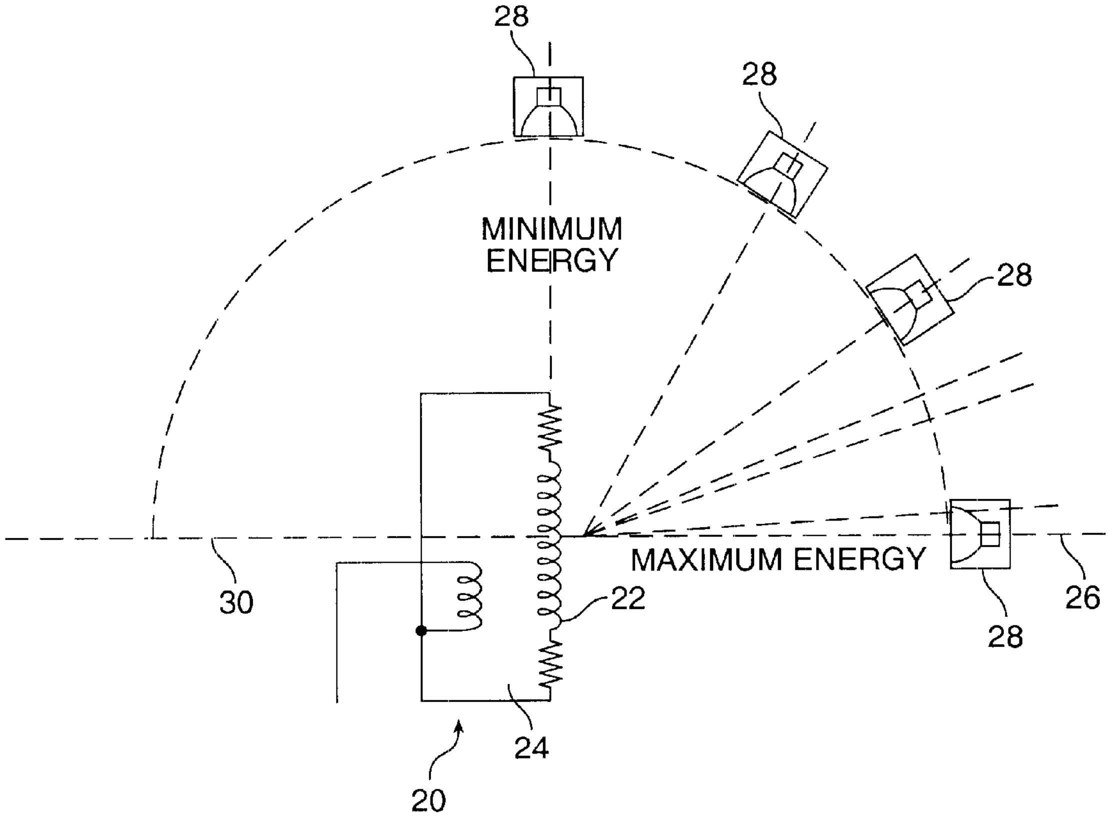
FIG. 3 illustrates the detection of sound energy vs. position relative to a microphone.
Figure 4:
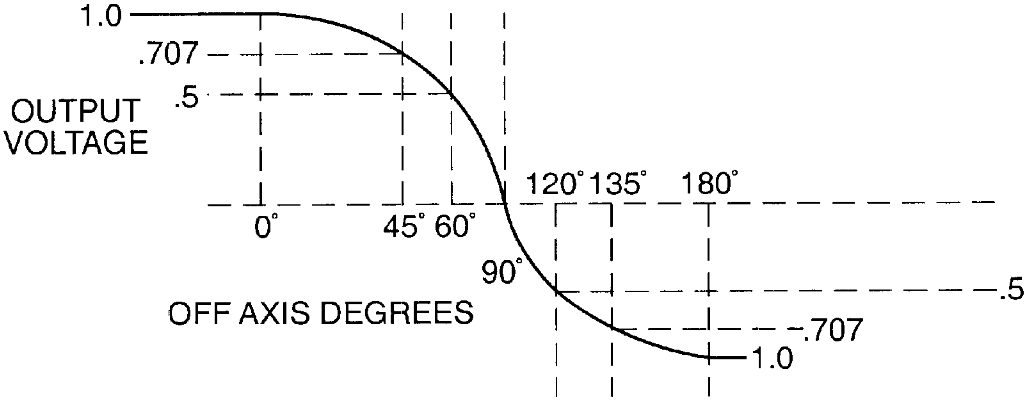
FIG. 4 is a graph of output voltage of the microphone of FIG. 3 vs. degrees off the major axis of the microphone.

FIG. 3 shows a typical omni-directional acoustic energy sensor 20 (i.e., a microphone). One side of the diaphragm 22, is chambered 24 to prevent acoustic energy from reaching it. The other is exposed to allow acoustic energy to be absorbed. Maximum energy transfer occurs when the incoming energy direction is perpendicular to the plane of the diaphragm 22. Minimum energy transfer occurs when the incoming direction is parallel to the plane of the diaphragm 22. The maximum energy direction is the major axis 26 of the sensor 20. Using the output obtained from a sound source 28 on this major axis 26 at a fixed distance DS from the diaphragm 22 as a reference equal to 1.0, we move the sound source 28 off axis incrementally maintaining the distance DS to the center of the diaphragm 22. The output voltage from the sensor approximates a cosine function as the sound source is rotated to 90° off axis (cosine 90° =0), as shown in FIG. 4. As the sound source is rotated beyond 90° the cosine relationship continues until it reaches a max at 180° along the minor axis 30. Note that the cosine functions of angles from 90° to 270° are negative. This indicates that the wave is propagating from an opposite.

Figure 5:
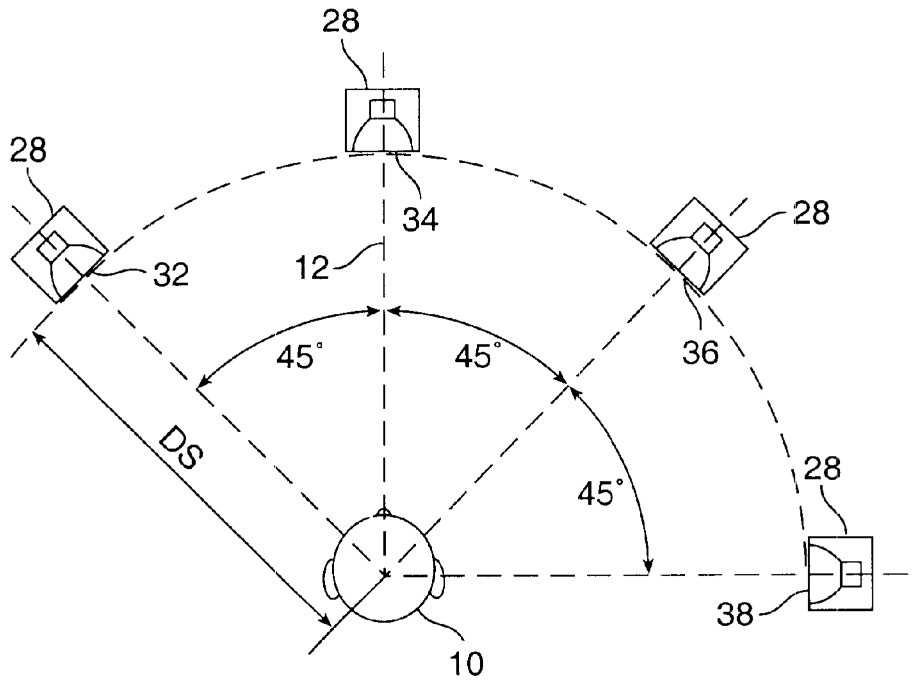
FIG. 5 illustrates a sound source at various positions relative to a listener's head.

A better understanding as to how this amplitude relationship allows a listener to perceive direction may be gained by analyzing what happens when a sound source 28 (FIG. 5) is rotated around a listener's 10 head at a fixed distance DS.

Initially, the source 28 is placed at the position 32 which corresponds to the major axis of the left ear which is 45° to the left of the listener's line of sight 12. At this position the level is adjusted so that 1.0 acoustic watt of energy reaches the left ear of the listener 10. The change of level of acoustic energy (watts) will vary as the square of the cosine of the angle off axis:

$$[W=\text{cosine}^2\theta]\theta=o^{ff\ axis}$$

The source 28 is moved to position 34. Position 34 is in the line of sight, which is 45° off the major axis of the left ear. The cosine of 45° is 0.707106781. The power coefficient is cosine$^2$ 45° which is 0.5. Therefore, only 0.5 watts of acoustic energy will be perceived by the left ear from the source 28 at position 34. Further rotation to position 36 results in total loss of energy perception by the left ear (cosine 90°=θ).

This is the position of minimum energy transform as shown in FIG. 3. It also roughly corresponds to the major axis of the right ear. This relationship is responsible for our ability to perceive sound direction accurately for roughly 360°. As the source is advanced to position 38, the energy perceived by the left ear increases until it equals approximately 0.5 watts at position 38, theoretically by my analysis. Actually, the rear hemisphere of the ear is less sensitive than the front hemisphere due to things like head barrier effect, etcetera. So actually, only about one half of the theoretical max is achieved by sources in the domain of the rear hemisphere.

The approximation equations for the rear hemisphere and the front hemisphere power transform are:

$$Wpf=Wa(\text{cosine}^2\ \theta) \quad \text{Eq. 1}$$

[θ less than 90° or greater than 270°]

$$Wpr=0.5Wa(\text{cosine}^2\ \theta) \quad \text{Eq. 2}$$

[θ greater than 90° but less than 270°]

Where

Wpf=energy perceived from a front source θ° off axis,

Wpr=energy perceived from the same but rear source θ° off axis, and

Wa=energy perceived from the same source on major axis position 32.

Figure 6:
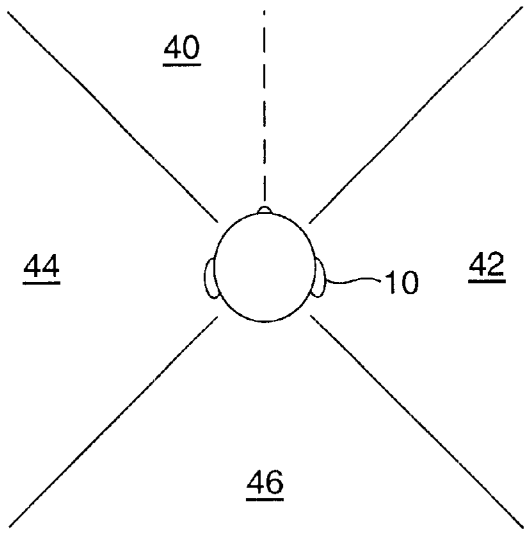
FIG. 6 illustrates a transform function of the sum of the acoustic energy perceived by both ears of a listener for a sound source in different quadrants.

The right ear has the same off axis power transform function as the left ear. The off axis angle of the right ear and the off axis angle of the left ear are complimentary. For any single source, the right ear angle to the source+the left ear angle to the source equals 90°. Therefore, the cosine of the left angle is equal to the sine of the right angle and visa-versa. Because sine$^2$ θ+cosine$^2$ θ=1, the sum of the energy perceived by both ears will remain constant for sound sources located within the front quadrant (+/−45° front line of sight), as shown in FIG. 6.

The transform function of the sum of the acoustic energy perceived by both ears is 1.0 in the front quadrant 40. A sound source in the right quadrant 42 or left quadrant 44 will involve a rear hemisphere coefficient of either the left or right ear and, therefore, the transform function will equal 0.75. The rear quadrant 46 will involve the rear hemisphere coefficient of both ears, therefore the transform function will be 0.5.

Figure 7:
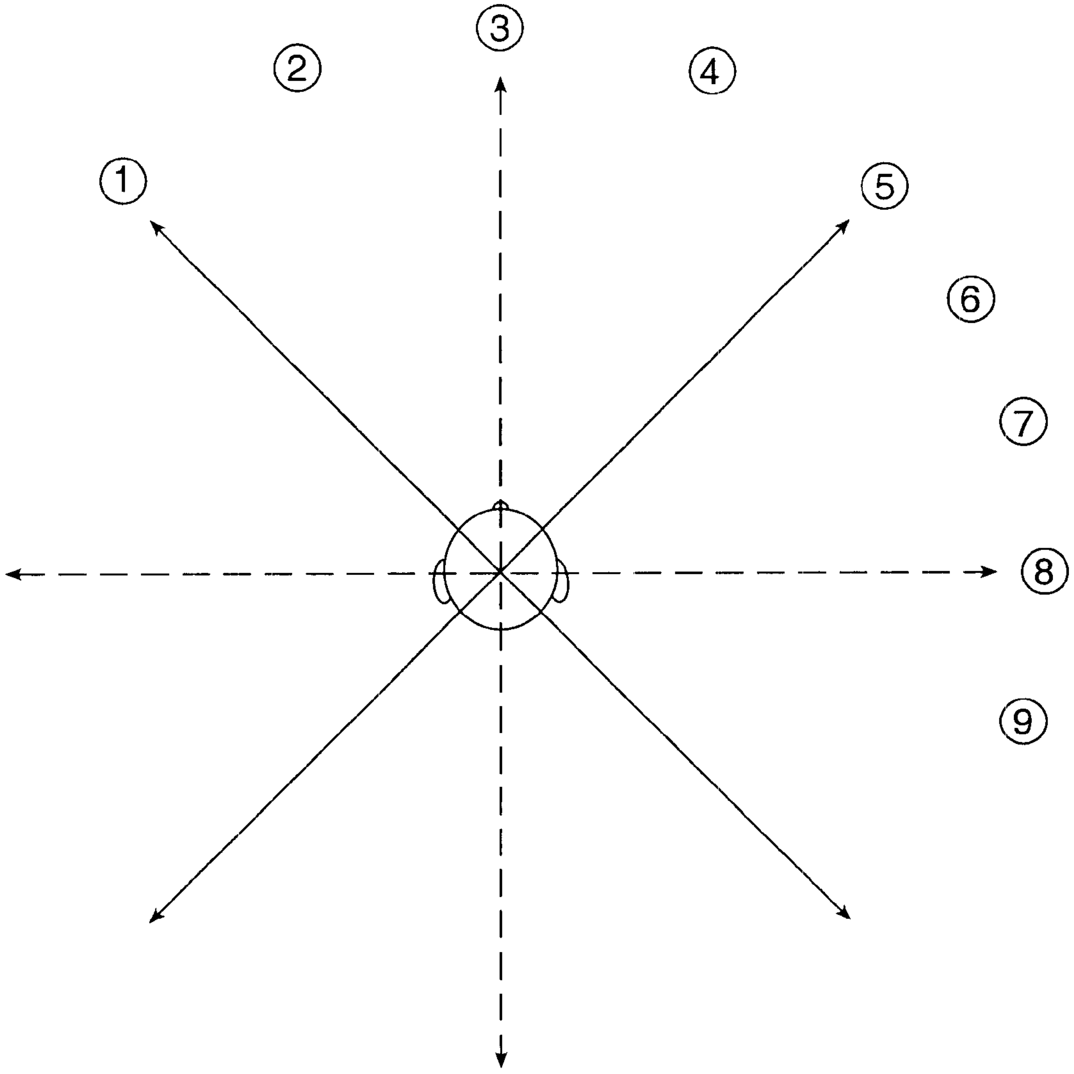
FIG. 7 illustrates a sound source position at different positions relative to a listener's head.

Using the approximation equations it is possible to predict the power ratios (Table I) for the left and right ears that will be perceived by a listener 10 as a sound source moves from position 1, in FIG. 7, to position 9. Table I identifies the perceived sound power at the left and right ears for each of the sound source positions.

TABLE I

| Pos. | Angle | L | R |
|---|---|---|---|
| 1 | 0° | 1.0 w | 0 w |
| 2 | 30° | .75 w | .25 w |
| 3 | 45° | .5 w | .5 w |
| 4 | 61.5° | .15 w | .85 w |
| 5 | 70° | 0 w | 1.0 w |
| 6 | 105° | .06 w | .94 w |
| 7 | 120° | .25 w | .75 w |
| 8 | 135° | .5 w | .5 w |
| 9 | 157.5° | .85 w | .15 w |

Figure 8:
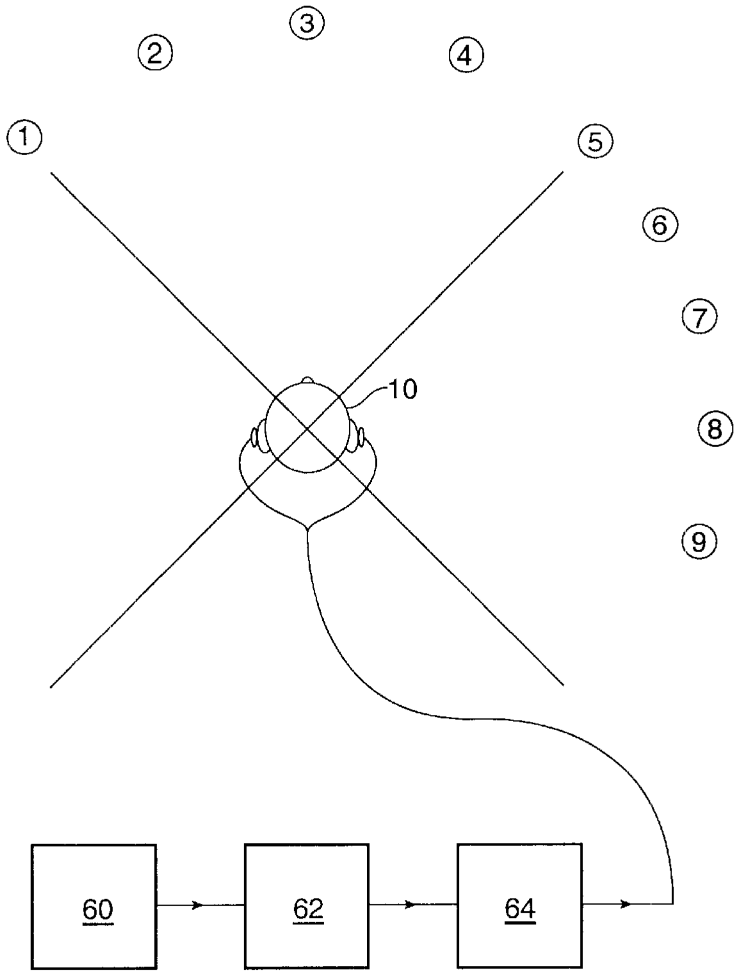
FIG. 8 illustrates providing pink noise of different power levels to the left and right ears of a listener via headphones.

Referring to FIG. 8, using a limited pink noise source 60 (200 to 7.0 kHz band only) and appropriate filter 62 and processing 64 apparatus, it would be possible to supply a listener 10 with left ear and right ear signals via headphones to produce the perception of direction, through positions 1 through 9, as predicted in FIG. 8. Table II indicates the perceived position of a sound source resulting from the procedure shown in FIG. 8. The left and right ear sound power signals provided to the listener 10 along with the corresponding perceived sound position are identical to that shown in Table I. Note that the underlining indicates inverse power notation which is discussed later in this specification.

TABLE II

| Pos. | Angle | L | R |
|---|---|---|---|
| 1 | 0° | 1.0 w | 0 w |
| 2 | 30° | .75 w | .25 w |
| 3 | 45° | .5 w | .5 w |
| 4 | 61.5° | .15 w | .85 w |
| 5 | 70° | 0 w | 1.0 w |
| 6 | 105° | .06 w | .94 w |
| 7 | 120° | .25 w | .75 w |
| 8 | 135° | .5 w | .5 w |
| 9 | 157.5° | .85 w | .15 w |

The listener 10 in the room with two speakers, one 45° left of line of sight and one 45° right of line of sight, as shown in FIG. 1, would also perceive the sound source directions as predicted in FIG. 6, if the processed L and R signals of FIG. 8 are supplied to the speakers shown in FIG. 1. In the real world, however, achieving a 45° by 45° speaker-listener relationship (90° DPA) is usually impractical, if not impossible.

It is now common that a stereo sound system is part of an entertainment system that includes a view screen. The presence of the view screen has the advantage of limiting the position of the listener or listeners. A listener will position himself or herself within the viewing area of the screen. Also, the distance from the screen to the listener/viewer is usually about four times the diagonal dimension of the screen (this distance of four times the diagonal dimension is usually considered optimum for CRT type displays).

Figure 9:
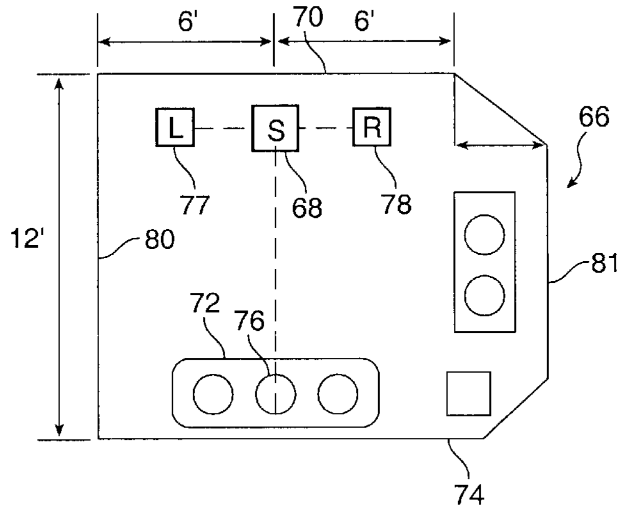
FIG. 9 is a top down view of a typical stereo system listening environment.

For discussion, I chose to use the dimensions of a typical listening/viewing environment, shown in FIG. 9.

The room 66 is basically a square with twelve-foot sides. It has been treated acoustically, primarily to prevent parallel wall reflection. The view screen 68 is centered approximately one and one half feet from the far wall 70. The listening/viewing area is primarily a couch 72 centered approximately one and one half feet from the apposite wall 74. The viewing screen 68 has a diagonal measurement of 27 inches or 2.25 feet. The distance from the screen 68 to a listener 76 seated on couch 72 is approximately nine feet, which is about 4 times the diagonal measurement of the viewing screen 68.

Figure 10:
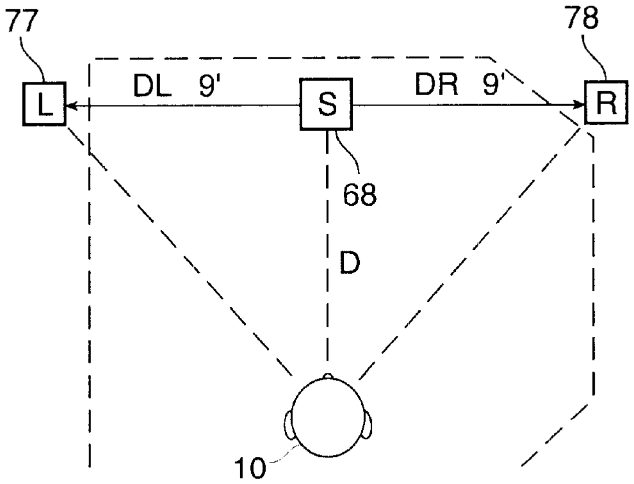
FIG. 10 illustrates the unachievable optimum location of speakers in the listening environment of FIG. 9.

Referring to FIG. 10, to achieve a 90° Differential Propagation Angle (the angular difference between the listener and the left and right speakers) would require that the left and right speakers 77 and 78 be positioned 9 feet to the left and 9 feet to the right, respectively, of the view screen 68.

Figure 11:
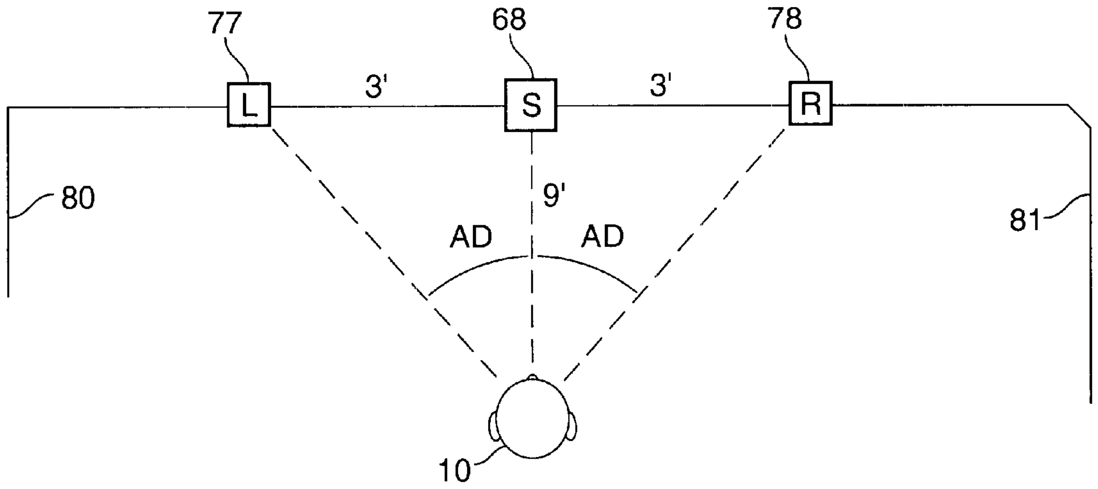
FIG. 11 illustrates the best compromise position of the speakers.

These ideal speaker positions do not lie within the boundaries of the room 66. Also, placing speakers too close to a corner or perpendicular wall produces reflections that undesirably alter the propagation pattern of the speaker. The most desirable compromising position for the speakers would be to locate them half way between the view screen 68 and the adjacent wall 80 and 81, as shown in FIG. 11. This position would supply maximum possible separation while minimizing undesirable reflections from the walls. The angular difference (AD) between the listener 76 and the left and right speakers would be approximately 37° (36.86°).

Figure 12:
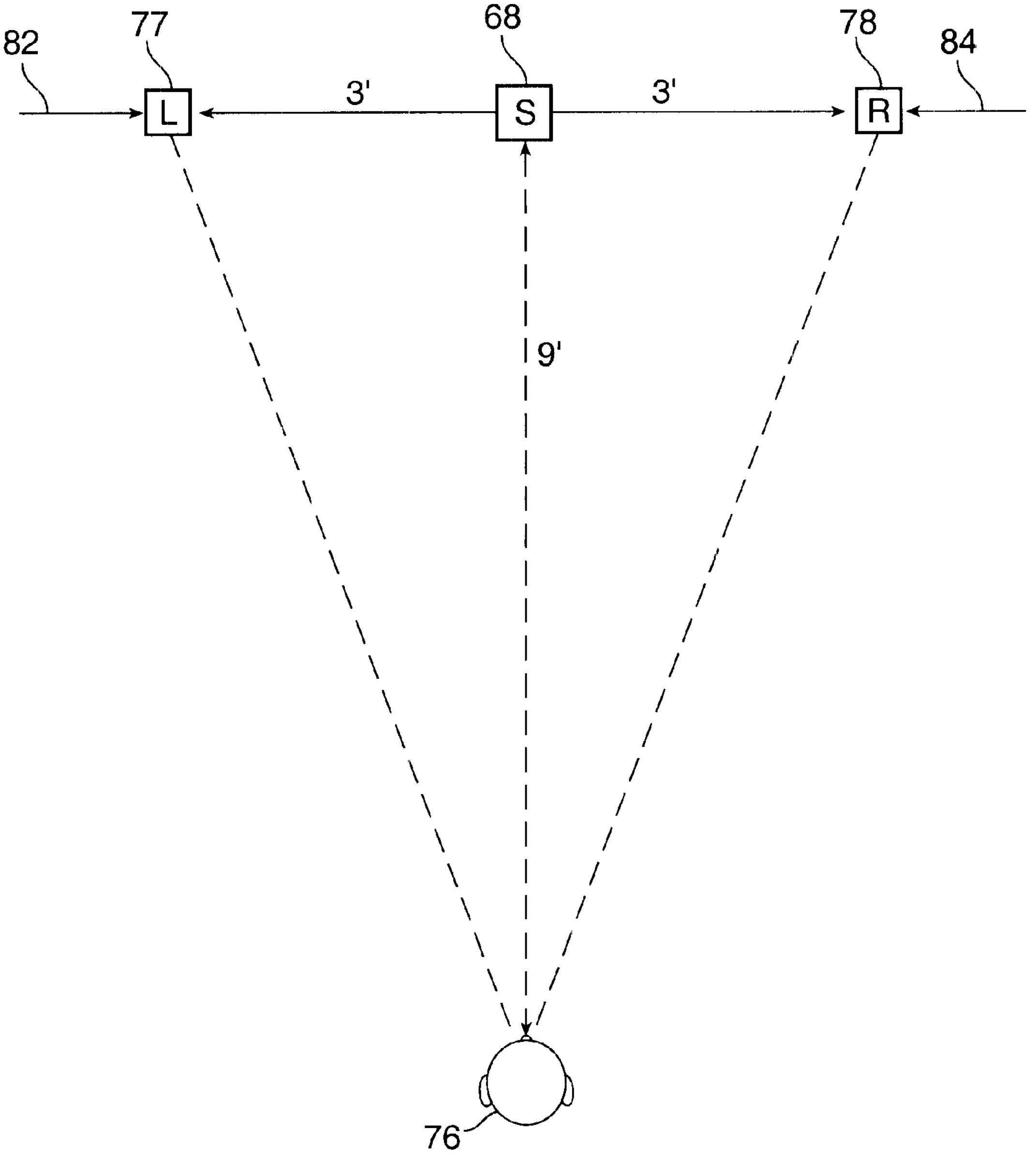
FIG. 12 illustrates the left and right acoustic power levels perceived by a listener when a signal A or B is applied to each speaker that would produce one acoustic watt perceived by the listener for each ear if the sound sources were located along the major axis of each ear.

Using the approximation equations, it is possible to predict the separation achieved by such placement of speakers. In FIG. 12, a signal (A) 82 is supplied to the left speaker 77 such that 1.0 acoustic watt would be perceived by a listener 76 at a distance of 9 feet if the left speaker were on either of his ears' axes (i.e., 45° off his line of sight). Likewise, a second equal signal (B) 84 is supplied to the right speaker 78. The left speaker 77 is in actuality 18.43° to the left of center (as defined by the view screen 68) and, therefore, it is 45°–18.43°, or 26.57° off the left ear major axis. Likewise, the right speaker 78 is 18.43° to the right of center or 26.57° off the right ear axis.

The left ear will perceive a 0.8 acoustic watt signal (A) 82 ($\text{cosine}^2\ \theta$ from eq. 1) and a 0.2 watt signal (B) 84. Likewise, the right ear will perceive a 0.8 watt signal (B) 84 and a 0.2 watt signal (A) 82. The difference for both will be 0.6 acoustic watt right (0.8 watt-0.2 watt) and 0.6 acoustic watt left (0.8 watt-0.2 watt). The total difference energy is 1.2 watt. The difference energy ratio is 1.2 W/2.0 W=0.6.

The same result for total difference energy in the system can be obtained by multiplying the total energy of the speakers (2 acoustic watts) by the sine of the Differential Propagation Angle (36.86°)a, i.e., sine 36.86°=0.6; 0.6×2 acoustic watts =1.2 watts.

Therefore, the differential energy perceived by a listener from two speakers is proportional to the product of the total acoustic energy of the speakers and the sine of the Differential Propagation Angle. The left and right sound image limits will be determined by the actual position of the left and right speakers.

It is possible to process the (A) & (B) signals 82 and 84 to achieve a greater degree of separation and hence increase the apparent DPA.

Inverse Power Notation

In previous text, I referred to some acoustic energy levels with a bar under the energy level ($\underline{1.0}$ watt). This notation indicates that this energy level is derived from the square of a negative function and such notations follow the algorithm:

$$1.0\text{ watt}+\underline{1.0}\text{ watt}=0,$$

and $$x^2=1.0,\text{ and }(-x)^2=1.0.$$

Figure 13:
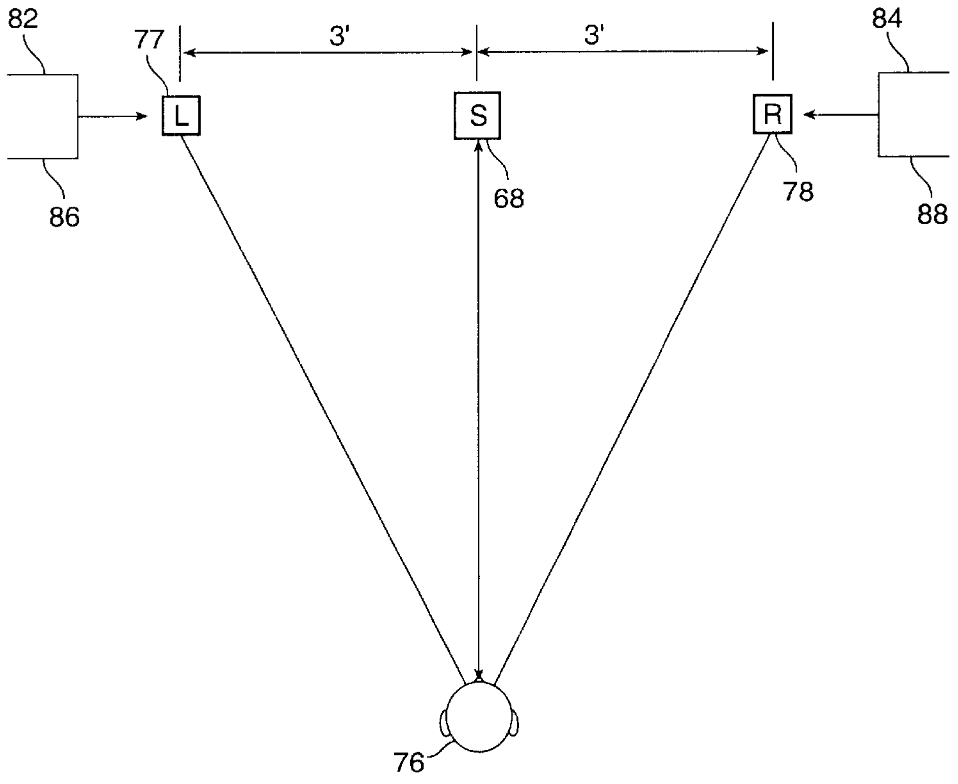
FIG. 13 illustrates composite signals A and B being applied to each sound source to affect the perception of sound source location.

FIG. 13 shows the two speakers as placed in room 66 in FIGS. 11 and 12. The left speaker 77 is supplied with a 1.0 w signal (A) 82 as before plus a second signal 86 equal to $\underline{0.2}$ w of signal (B). Likewise, the right speaker 78 is supplied with a signal 84 of 1.0 w of signal (B) plus a signal 88 equal to $\underline{0.2}$ w (A). Calculating the perceived sound is as follows:

Perceived sound by left ear:

From L speaker: 0.8 (1.0 wA+$\underline{0.2}$ w B)

From R speaker: 0.2 (1.0 wB+$\underline{0.2}$ w A)

Total perceived sound by left ear=0.76wA+0.4 wB

Perceived sound by right ear:

From L speaker: 0.8 (1.0 wB+$\underline{0.2}$ w A)

From R speaker: 0.2 (1.0 wA+$\underline{0.2}$ w B)

Total perceived sound by right ear 0.76 wB+0.4 wA

Total perceived energy=0.76 wA+0.4 wB+0.76 wB+0.4 wA=1.6 w.

Differential energy=0.76 wA–0.4 wB+0.76 wB–0.4 wA=1.44 w.

Differential energy ratio=1.44 w/1.60 w=0.9.

Arc sine (0.9)=64.16° =apparent DPA.

The result is that a differential ratio of 0.9 is perceived by the listener 76 and, consequently, the listener 76 perceives the left and right sound source to be 32.08° to the right and left of center, which corresponds to a DPA of 64.16° The cost of producing this apparent increase of DPA is paid for with a corresponding loss of total acoustic energy transfer efficiency. The total propagated energy of the left and right speakers equals 2.4 watts. Only 1.6 watts of energy is perceived by the listener 76, which represents a perceived energy ratio of 0.6667 or 67%. The energy loss (33%) provides the energy to produce the apparent increase in DPA. Increasing the counter energy signal (wB to left speaker and wA to right speaker) provides a corresponding increase in DPA with corresponding increase of loss of energy transfer efficiency.

Figure 14:
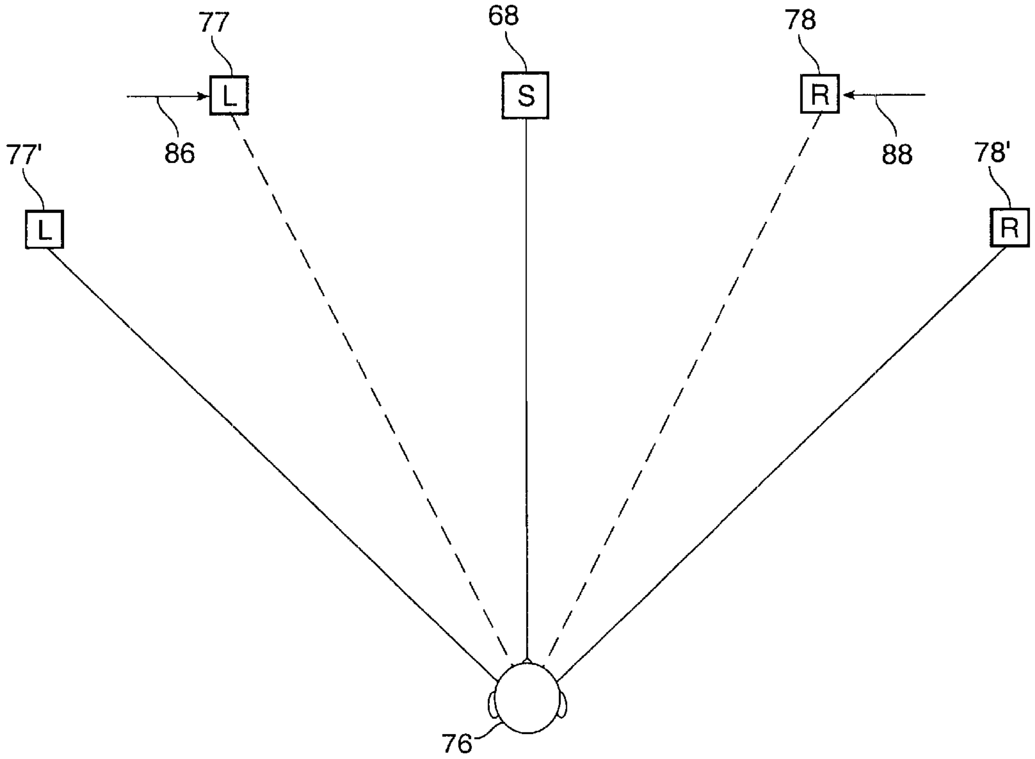
FIG. 14 illustrates the perceived locations of the speakers after compensation by adding inverse signal components.

As shown in FIG. 14, a listener 76 who perceives acoustic energy from two speakers 77 and 78 located at positions 1 and 2 (DPA 36.86°) will perceive the speakers' acoustic positions (shown as perceived speakers 77' and 78') to be positions 3 and 4 if the aforementioned inverse components are added to the speakers.

The Listening Space and Differential Propagation Distance (DPD)

Figure 15:
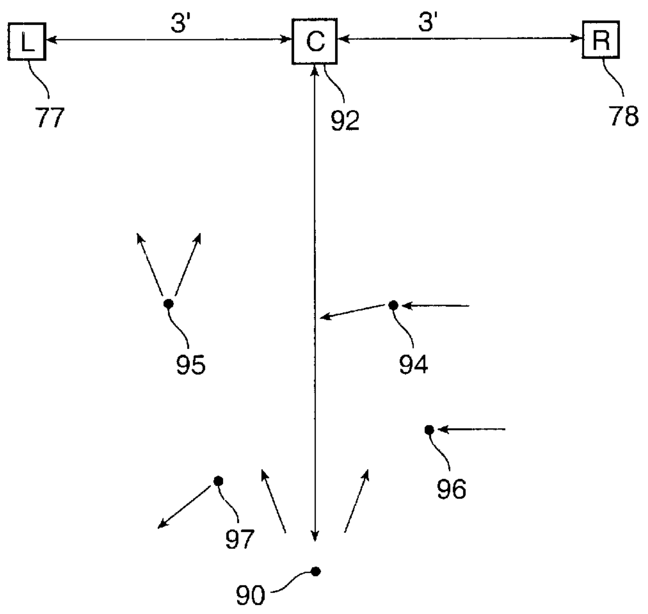
FIG. 15 illustrates a microphone placed at different positions.

As shown in FIG. 15, with the speakers 77 and 78 in the same position as described in FIG. 11, a singular listening point is located 9 feet from the center reference point (CTR) 92 and equidistant from the two speakers 77 and 78 such that the distance DL from this listening point 90 to the left speaker 77 is equal to the distance DR from this point 90 to the right speaker 78. This distance is calculated as 9.48 feet or 2.89 meters.

Acoustic energy propagated by speaker 77 at time To will reach position 90 at a time equal to $T_o$ plus the result of DL (2.89 meters) divided by the propagation velocity of acoustic energy in the air occupying the space between point 90 and speaker 77. This propagation velocity is approximately 0.334 meters per millisecond, which gives the arrival time as $T_o$+(2.89 meters/0334 meters/ms) or $T_o$+8.65 milliseconds. Likewise because the right speaker 78 is equidistant from point 90, the acoustic energy arrival time at point 90 from speaker 78 will also be $T_o$+8.65 milliseconds. The difference in arrival time will be 0 seconds. All points that lie in a plane perpendicular to the drawing sheet and through the line between point 90 and center reference point 92 will be equidistant from the speakers 77 and 78. All points located outside this plane will not be equidistant from the two speakers 77 and 78. Therefore, the arrival times of energy from the left and right speakers will be unequal, and this inequality will be proportional to the difference in distance to the two speakers. The distance is the Differential Propagation Distance or DPD. The arrival time difference produced by the propagation distance difference determines the spectral energy perceived at any point outside the plane of equa-distance.

A microphone (illustrated by a dot) placed at various points 94, 95, 96, and 97 in FIG. 15 will perceive the acoustic energy at that point as a series of nodes and nulls that are harmonically related to the wavelength of the DPD. For example, point 94 is a point with a DPD of 33.4 cm. The wavelength is equal to a frequency of 1000 Hertz, which means that if pink noise is supplied to speakers 77 and 78, the amplitude of all frequencies harmonically related to 1000 Hz will be altered. The frequencies involved will be F=1.0 KHz×$2^n$. Fourier analysis also predicts this amplitude variation. Every point outside the previously mentioned plane between point 90 and 92 will have a specific amplitude transform proportional to the DPD of that point.

Human beings perceive acoustic energy with two sensors (ears) simultaneously, which means that the total energy perceived is equal to the sum or difference of the two spectral transforms perceived by the two sensors. And as these sensors are approximately 12.5 cm apart, the difference or sum perceived will be harmonically related to the time required for acoustic energy to travel this distance. This time is approximately 0.374 milliseconds.

This time is proportional to a frequency of 2.67 kHz. Therefore, all frequencies harmonically related to this frequency (2.67 kHz)($2^n$) will have an even harmonic wavelength (12.5 cm)($2^n$) and are most likely to be perceived by both ears when propagated by either speaker. Conversely, frequencies with a harmonic wavelength equal to an odd multiple of this wavelength (WL) will most likely be perceived by only one ear. Where, $$WL=(12.5\text{ cm})(\sqrt[3]{\sqrt{2}})(2^n)$$

Modern "stereo" recordings aren't really stereo recordings. They consist of several mono tracks that are mixed into a two channel (stereo) format. These tracks, when mixed, fall into two major designations: separate (only on the left or right) and correlated (equally mixed on the left and right). The objective of the correlated signals (those mixed equally on the left and right) is to produce a center channel image. The center channel image is typically used for vocals or solo instruments in music, and for dialogue in movies.

The technique described with respect to FIGS. 13 and 14 will increase the apparent DPA of the system. However, the process of adding inverse power to the channels will also subtract correlated information from the channels.

Currently used techniques for increasing the spatial quality sound (actually increasing the DPA) suffer from a weakening of the center channel image. Typically, the center channel image is the most important aspect of the sound presentation. Also, no currently used technology has any provision for adjusting the DPA altering component to accommodate the different requirements of actual speaker DPA.

One embodiment of the current invention includes provisions for compensating for different speaker DPA's as well as correlation functions to compensate for the loss of correlated energy with respect to the introduction of a DPA increasing component.

DETAIL OF THE INVENTION

A Processing Algorithm for one embodiment of the invention is as follows:

First, the left and right speaker signals are each separately divided spectrally into three parts. The first part includes low frequencies from 20 to 200 Hz and is labeled $L_{LF}$ or $R_{LF}$. The second part includes mid-range frequencies from 200 to 7,000 Hz and is labeled $L_{MR}$ or $R_{MR}$. The third part includes high frequencies from 7,000 to 20,000 Hz and is labeled $L_{HF}$ or $R_{HF}$.

Next, the sum of the $L_{MR}$ and $R_{MR}$ is derived simply by adding the two functions. The difference is also derived by subtracting the two functions $L_{MR}-R_{MR}$ and $R_{MR}-L_{MR}$. We now have nine components to process: $L_{LF}$, $R_{LF}$, $L_{MR}$, $R_{MR}$, $L_{MR}+R_{MR}$, $L_{MR}-R_{MR}$, $R_{MR}-L_{MR}$, $R_{HF}$, and $L_{HF}$. The mid-range sum and difference signals ($L_{MR}+R_{MR}$, $L_{MR}-R_{MR}$, $R_{MR}-L_{MR}$) are then shifted (by either time or phase) and re-combined. These resultant mid-range transform functions are then re-combined with the high and low frequency signals to output the resulting left and right speaker signals.

Figure 16:
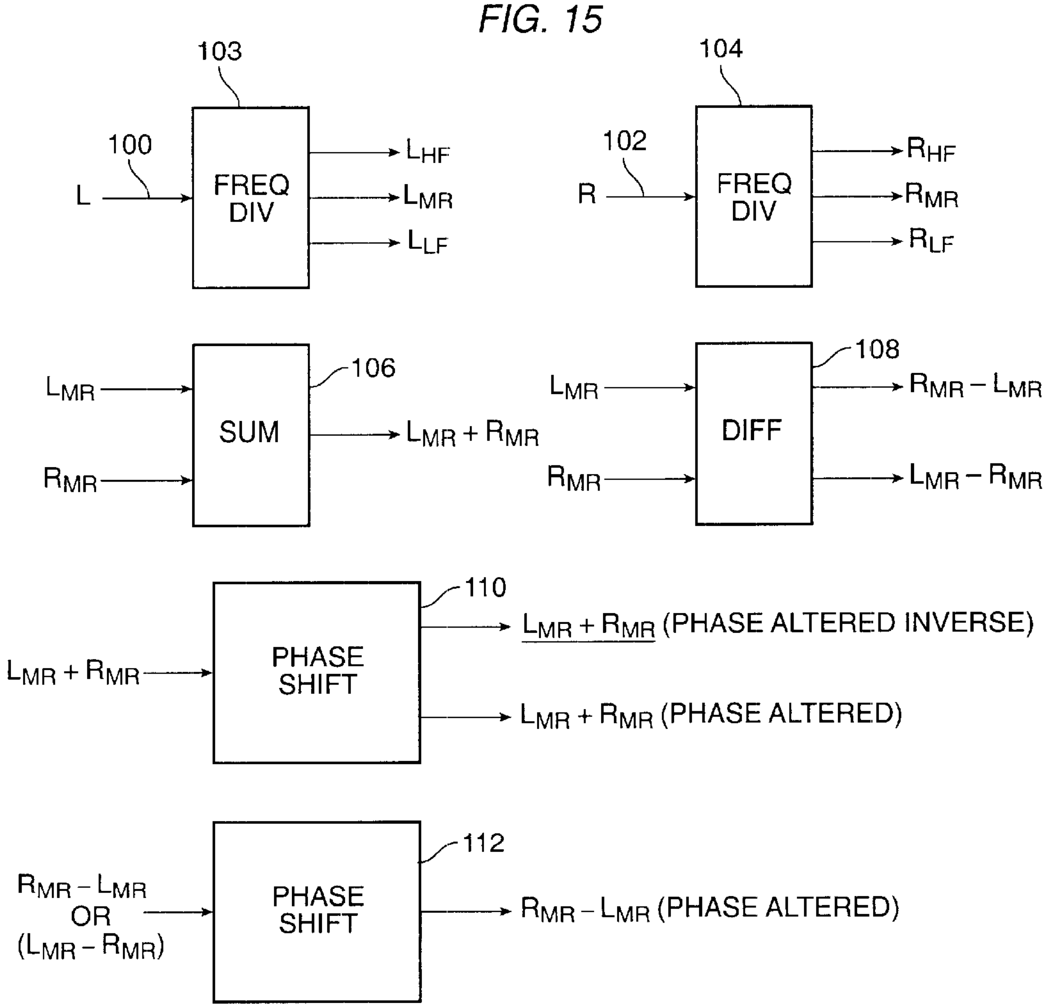
FIG. 16 illustrates an apparatus for processing audio signals in accordance with one embodiment of the invention.
Figure 17:
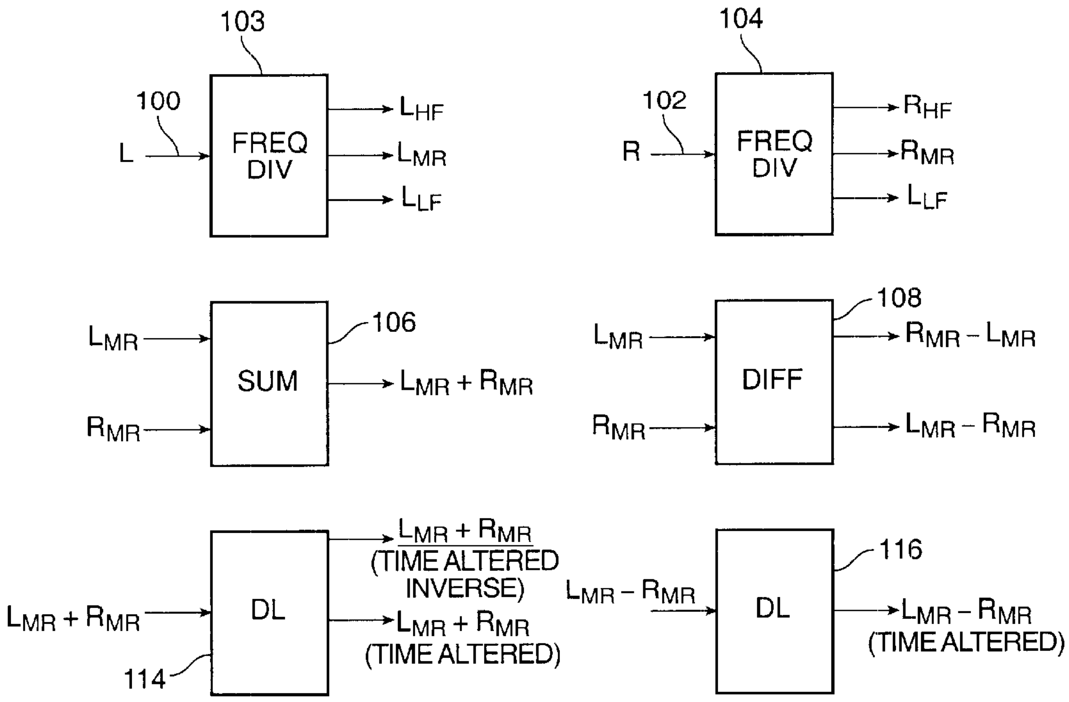
FIG. 17 illustrates an apparatus for processing audio signals in accordance with another embodiment of the invention.

Analog processing may be achieved using two preferred embodiments of the invention shown in FIGS. 16 and 17.

In FIG. 16, the left signal 100 and right signal 102 are each input to one of two frequency dividing networks 103 and 104, respectively. Frequency division parameters for both networks are as follows: low frequency information is separated by a third order (18 db/octave) low-pass filter and output as $L_{LF}$ and $R_{LF}$ respectively. Mid-band information is separated by a as third order band-pass filter with 200 Hz and 2,000 Hz as the upper and lower limits of the band. This mid band is output as $L_{MR}$ and $R_{MR}$ respectively. High frequency information is separated by a third order high-pass filter at 7,000 Hz and is output as $L_{HF}$ and $R_{HF}$ respectively. The $L_{MR}$ and $R_{MR}$ signals are simultaneously applied to the input of a summing junction 106 and a difference amplifier 108. The summing junction 106 outputs the sum ($L_{MR}+R_{MR}$), and the difference amplifier 108 outputs both difference signals ($L_{MR}-R_{MR}$) and ($R_{MR}-L_{MR}$).

The output of summing junction 106 is applied to the input of a phase shifting network 110 that is designed such that the 0° phase relationship nodes of $L_{MR}+R_{MR}$ occur at frequencies that corresponds to even multiples of the head wavelength (12.5 cm). This causes all 0° phase shifts to occur at frequencies whose wavelength is (12.5 cm×$2^n$). One of the outputs of the difference amplifier 108 is supplied to the input of a similar phase shifting network 112 designed such that the ($R_{MR}$–$L_{MR}$) or 0° ($L_{MR}$–$R_{MR}$) phase shifts occur at odd multiples of the head wavelength (12.5 cm). All 0° phase shifts will, thus, occur at frequencies whose wavelength is In the alternate embodiment of FIG. 17, the left and right signals 100 and 102 are input to two frequency dividing networks 103 and 104, identical to those described in detail in FIG. 16. The $L_{MR}$ and $R_{MR}$ outputs of the two frequency divided networks are fed simultaneously to a summing junction 106 and a difference amplifier 108, also as in FIG. 16. The output of the summing junction 106 is supplied to the input of a delay line 114. The delay of this delay line 114 is equal to an even multiple of the head wavelength time or $0.374\times 2^{n}$)ms. One of the outputs of the difference amplifier 108 is supplied to a second delay line 116. The delay of delay line 116 is equal to an odd multiple of the head wavelength time or $$(0.374)(\sqrt[3]{\sqrt{2}})(2^{n})\text{ms}$$

In both embodiments, the integer (n) is selected such that the first node occurs within the first octave of the pass band (200 to 400 Hz).

Figure 18:
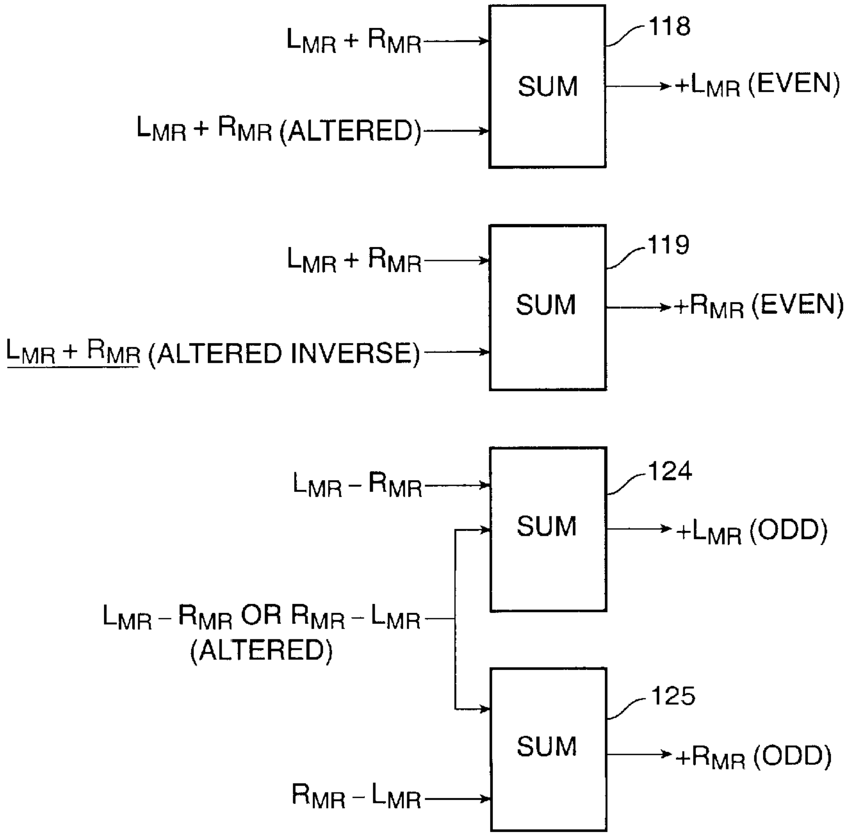
FIG. 18 illustrates an apparatus for further processing of signals generated in FIGS. 16 and 17.

FIG. 18 shows two sets of summing junctions. In the first set, consisting of summing junctions 118 and 119, the sum ($L_{MR}$ +$R_{MR}$) is combined first in summing junction 118 with the phase (FIG. 16) or time (FIG. 17) altered function of the sum ($L_{MR}$+$R_{MR}$ altered). In summing junction 119, the sum ($L_{MR}$+$R_{MR}$) is combined with the inverse altered function of the sum ($L_{MR}$+$R_{MR}$ altered). Two complimentary Fourier Transform Functions harmonically related to an even function of the head wavelength will result. These two outputs are each supplied to the summing junction outputs from summing junctions 124 and 125.

The second set summing junction 124is used to sum the difference ($L_{MR}$–$R_{MR}$) with the phase or time difference ($L_{MR}$–$R_{MR}$ or $R_{MR}$–$L_{MR}$ altered). In summing junction 125, the difference ($R_{MR}$–$L_{MR}$) is summed with the phase or time altered difference ($L_{MR}$–$R_{MR}$ or $R_{MR}$–$L_{MR}$ altered). The output of summing junction 124 is a +$L_{MR}$ Fourier Transform that is harmonically related to an odd multiple of the head wavelength. Conversely, the output of summing junction 125 is a +$R_{MR}$ Fourier Transform that is also harmonically related to an odd multiple of the head wavelength.

Figure 19:
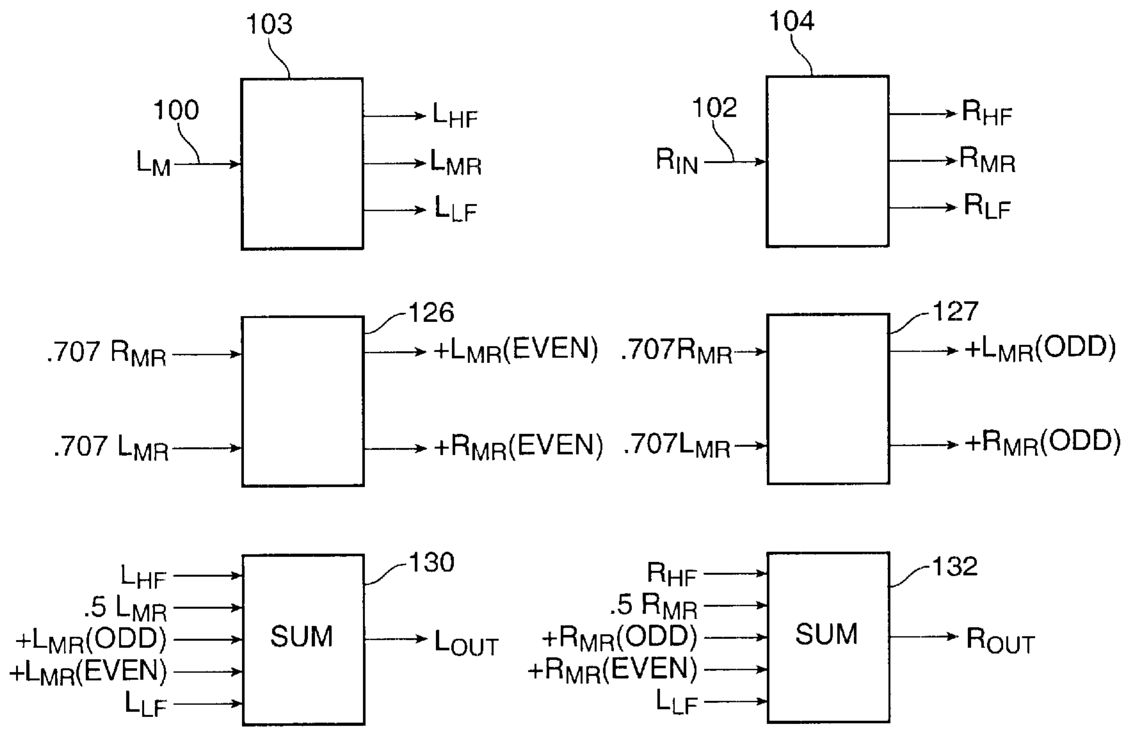
FIG. 19 is a complete block diagram of one apparatus for carrying out the invention.

FIG. 19 shows a complete block diagram of both preferred embodiments. Blocks 126 and 127 perform the various summing and difference functions shown in FIGS. 17 and 18. Along with the aforementioned sets of transform functions components, $L_{LF}$($R_{LF}$), 0.5 $L_{MR}$(0.5 $R_{MR}$), and $L_{HF}$($R_{HF}$) are added to the appropriate output summing functions by summing junctions 130 and 132 to output the resulting left and right speaker signals, respectively.

The gain of the various transform functions are adjustable such that the sum transform is multiplied by K sine DPA and the difference transform is multiplied by K cosine DPA. A single dual section potentiometer may be used with the sections wired inversely (to achieve the cosine and sine functions) such that the potentiometer shaft position is indexed to the appropriate DPA. It should be here noted that the constants K and 0.5 $L_{MR}$ or 0.5 $R_{MR}$ are somewhat flexible and may be varied to obtain the desired effect.

Hence, what has been described is an apparatus for increasing the perceived DPA of stereo speakers while not weakening the center channel image. This is accomplished, in part, by taking into account the time delay between sounds arriving at the two ears of a listener (or the phase shift of the sound arriving at the two ears). The apparatus also allows the user to optimize the sound results by inputting the DPA of the actual stereo speakers relative to the listener.

Figure 20:
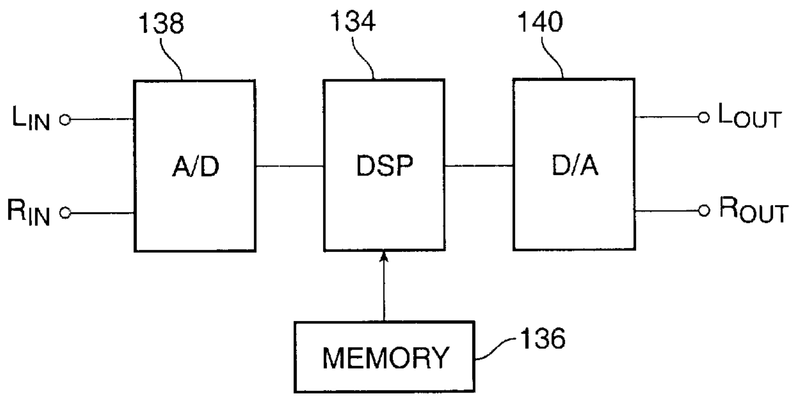
FIG. 20 is a complete block diagram of another apparatus for carrying out the invention which uses a digital signal processor rather than hard-wire circuitry.

A third embodiment of the invention makes use of a Digital Signal Processor (DSP) carrying out the algorithm described above. A diagram of a DSP 134 is shown in FIG. 20. A memory 136 may store the algorithm performed by the DSP 134. An analog-to-digital converter converts the original left and right speaker signals into digital signals for processing by the DSP 134. A digital-to analog converter 140 provides left and right speaker analog output signals for amplification. A provision is also made for adjustment by the user of the transform functions based on the DPA of the speakers. In closing, I would like to state that the whether the phase or time domain analog methods or the DSP methods are used, as long as the transform functions are performed as stated in this text the object of the invention will be equally achieved.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

I claim:

1. A method for enhancing left (L) and right (R) audio signals, comprising the steps of:

dividing the left and right speaker signals into low range ($L_{LF}$, $R_{LF}$), mid-range ($L_{MR}$ and $R_{MR}$) and high range ($R_{HF}$ and $L_{HF}$) frequency signals;

summing $L_{MR}$ and $R_{MR}$ to produce $L_{MR}$+$R_{MR}$;

subtracting $L_{MR}$ from $R_{MR}$ to produce $R_{MR}$–$L_{MR}$;

subtracting $R_{MR}$ from $L_{MR}$ to produce $L_{MR}$–$R_{MR}$;

shifting $L_{MR}$+$R_{MR}$ to produce shifted mid-range sum signal;

shifting one of $R_{MR}$–$L_{MR}$ and $L_{MR}$–$R_{MR}$ to produce shifted mid-range difference signal;

inverting the shifted mid-range sum signal to produce inverted mid-range sum signal;

combining $L_{MR}$+$R_{MR}$, shifted mid-range sum signal, $L_{MR}$–$R_{MR}$, shifted mid-range difference signal, $L_{LF}$, and $L_{HF}$ to produce an enhanced left audio signal; and combining $L_{MR}$+$R_{MR}$, inverted mid-range sum signal, $R_{MR}$–$L_{MR}$, shifted mid-range difference signal, $R_{LF}$, and $R_{HF}$ to produce an enhanced right audio signal.

2. The method recited in claim 1, wherein the low range frequencies are from 20 to 200 Hz, the mid-range frequencies are from 200 to 7,000 Hz and the high range frequencies are from 7,000 to 20,000 Hz.

3. The method recited in claim 1, wherein $L_{MR}$+$R_{M}$, $R_{MR}$–$L_{MR}$, and $L_{MR}$–$R_{MR}$ are shifted by time.

4. The method recited in claim 1, wherein $L_{MR}$+$R_{M}$, $R_{MR}$–$L_{MR}$, and $L_{MR}$–$R_{MR}$ are shifted by phase.

5. An apparatus for enhancing left (L) and right (R) audio signals, comprising:

means for dividing the left and right speaker signals into low range ($L_{LF}$, $R_{LF}$), mid-range ($L_{MR}$ and $R_{MR}$) and high range ($R_{HF}$ and $L_{HF}$) frequency signals;

means for summing $L_{MR}$ and $R_{MR}$ to produce $L_{MR}$+$R_{MR}$;

means for subtracting $L_{MR}$ from $R_{MR}$ to produce $R_{MR}$–$L_{MR}$;

means for subtracting $R_{MR}$ from $L_{MR}$ to produce $L_{MR}$–$L_{MR}$;

means for shifting $L_{MR}$+$R_{MR}$ to produce shifted mid-range sum signal;

means for shifting $R_{MR}-L_{MR}$ or $L_{MR}-R_{MR}$ to produce shifted mid-range difference signal;

means for inverting the shifted mid-range sum signal to produce inverted mid-range sum signal;

means for combining $L_{MR}+R_{MR}$, shifted mid-range sum signal, $L_{MR}-R_{MR}$, shifted mid-range difference signal, $L_{LF}$, and $L_{HF}$ to produce an enhanced left audio signal; and means for combining $L_{MR}+R_{MR}$, inverted mid-range sum signal, $R_{MR}-L_{MR}$, shifted mid-range difference signal, $R_{LF}$, and $R_{HF}$ to produce an enhanced right audio signal.

6. The apparatus recited in claim 5, wherein the low range frequencies are from 20 to 200 Hz, the mid-range frequencies are from 200 to 7,000 Hz and the high range frequencies are from 7,000 to 20,000 Hz.

7. The apparatus recited in claim 5, wherein the shifted mid-range sum signal and the shifted mid-range difference signal are shifted by time.

8. The apparatus recited in claim 5, wherein the shifted mid-range sum signal and the shifted mid-range difference signal are shifted by phase.

* * * * *